US010369752B2

(12) United States Patent
Mossavat et al.

(10) Patent No.: US 10,369,752 B2
(45) Date of Patent: Aug. 6, 2019

(54) METROLOGY METHOD AND APPARATUS, COMPUTER PROGRAM AND LITHOGRAPHIC SYSTEM

(71) Applicant: ASML Netherlands B.V., Veldhoven (NL)

(72) Inventors: Seyed Iman Mossavat, Waalre (NL); Adriaan Johan Van Leest, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 480 days.

(21) Appl. No.: 15/138,903

(22) Filed: Apr. 26, 2016

(65) Prior Publication Data

US 2016/0325504 A1    Nov. 10, 2016

(30) Foreign Application Priority Data

May 7, 2015 (EP) .................... 15166833

(51) Int. Cl.
*G06F 7/66* (2006.01)
*B29C 67/00* (2017.01)
(Continued)

(52) U.S. Cl.
CPC ........ *B29C 67/0088* (2013.01); *B29C 64/386* (2017.08); *G03F 7/705* (2013.01);
(Continued)

(58) Field of Classification Search
CPC ..................................................... B33Y 50/02
(Continued)

(56) References Cited

U.S. PATENT DOCUMENTS 6,591,405 B1    7/2003  Doddi
6,609,086 B1    8/2003  Bao et al.
(Continued)

FOREIGN PATENT DOCUMENTS

WO    WO 2013/007927 A1    1/2013
WO    WO 2014/074893 A1    5/2014

OTHER PUBLICATIONS

International Search Report and Written Opinion of the International Searching Authority directed to related International Patent Application No. PCT/EP2016/058344, dated Jul. 27, 2016; 9 pages.
(Continued)

*Primary Examiner* — Mohammad Ali
*Assistant Examiner* — Md Azad
(74) *Attorney, Agent, or Firm* — Sterne, Kessler, Goldstein & Fox P.L.L.C.

(57) ABSTRACT

Disclosed are a method, computer program and associated apparatuses for metrology. The method includes acquiring inspection data comprising a plurality of inspection data elements, each inspection data element having been obtained by inspection of a corresponding target structure formed using a lithographic process; and performing an unsupervised cluster analysis on said inspection data, thereby partitioning said inspection data into a plurality of clusters in accordance with a metric. In an embodiment, a cluster representative can be identified for each cluster. The cluster representative may be reconstructed and the reconstruction used to approximate the other members of the cluster.

15 Claims, 6 Drawing Sheets

(51) Int. Cl.
*G03F 7/20* (2006.01)
*G05B 19/4099* (2006.01)
*B29C 64/386* (2017.01)
*B33Y 50/02* (2015.01)

(52) U.S. Cl.
CPC ..... *G03F 7/70625* (2013.01); *G05B 19/4099* (2013.01); *B33Y 50/02* (2014.12); *G05B 2219/35134* (2013.01); *G05B 2219/49007* (2013.01)

(58) Field of Classification Search
USPC .......................................................... 700/98
See application file for complete search history.

(56) References Cited

U.S. PATENT DOCUMENTS

| | | | |
|---|---|---|---|
| 6,636,843 B2 | 10/2003 | Doddi et al. | |
| 6,857,114 B2 | 2/2005 | Doddi | |
| 9,098,891 B2 | 8/2015 | Kulkarni et al. | |
| 2006/0273266 A1* | 12/2006 | Preil | G03F 1/84 250/548 |
| 2007/0288185 A1* | 12/2007 | Burch | G05B 23/024 702/81 |
| 2007/0288219 A1* | 12/2007 | Zafar | G03F 1/84 703/14 |
| 2008/0170780 A1 | 7/2008 | Cramer et al. | |
| 2008/0250384 A1* | 10/2008 | Duffy | G03F 7/70525 716/55 |
| 2013/0083306 A1* | 4/2013 | Smirnov | G03F 7/70625 355/67 |
| 2013/0135600 A1 | 5/2013 | Middlebrooks et al. | |
| 2014/0136137 A1 | 5/2014 | Tarshish-Shapir et al. | |

OTHER PUBLICATIONS

Gao, Jhih-Rong et al. "Accurate Lithography Hotspot Detection based on PCA-SVM Classifier with Hierarchical Data Clustering" SPIE 9053 90530E (2014) Univ. of Texas at Austin 1-10.

Krukar, Richard et al., "Reactive ion etching profile and depth characterization using statistical and neural network analysis of light scattering data" J. Appl. Phys. 74 (6) (1993) 3698-3706.

Kumar, Pardeep et al. "Fast and accurate lithography simulation using cluster analysis in resist building" JMMM 14(2) 023506 (2015) 1-6.

Park, Eun-mi et al. "Classifying Imbalanced Data using an Svm Ensemble with k-means Clustering in Semiconductor TEST Process" SPIE 9067 90672D (2013) Samsung 1-4.

Top, Mame Kouna et al. "Outliers Detection by Fuzzy Classification Method for Model Building" SPIE 7272 72721G (2009) STMicroelectronics 1-8.

Yu, Bei et al. "Accurate lithography hotspot detection based on principal component analysis-support vector machine classifier with hierarchical data clustering" JMMM 14(1) 011003 (2014) 1-12.

* cited by examiner

METROLOGY METHOD AND APPARATUS, COMPUTER PROGRAM AND LITHOGRAPHIC SYSTEM

CROSS REFERENCE TO RELATED APPLICATIONS

This application claims benefit to EP Application EP15166833.2 which is incorporated by reference herein in its entirety.

BACKGROUND

Field of the Invention

The present invention relates to methods and apparatuses for metrology usable, for example, in the manufacture of devices by lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction image or pattern from which a property of interest of the target can be determined.

In order that the radiation that impinges on to the substrate is diffracted, an object with a specific shape is printed on to the substrate and is often known as a scatterometry target or simply target. As mentioned above, it is possible to determine the actual shape of a scatterometry object using a cross-section scanning electron microscope and the like. However, this involves a large amount of time, effort and specialized apparatus and is less suited for measurements in a production environment because a separate specialized apparatus is required in line with normal apparatus in, for example, a lithographic cell.

Determination of the property of interest may be performed by various techniques: e.g., reconstruction of the target by iterative approaches such as rigorous coupled wave analysis or finite element methods; library searches; and principal component analysis.

To perform such reconstructions, a profile may be used. To make the profile more robust, good nominal values for parameters (representative of the data as a whole) should be chosen.

It is desirable to provide a method which can help with choosing such nominal values.

SUMMARY OF THE INVENTION

The invention in a first aspect provides a method of metrology comprising: acquiring inspection data, said inspection data comprising a plurality of inspection data elements, each inspection data element having been obtained by inspection of a corresponding target structure formed using a lithographic process; and performing an unsupervised cluster analysis on said inspection data, thereby partitioning said inspection data into a plurality of clusters in accordance with a metric.

The invention in a second aspect provides a metrology apparatus operable to perform the method of the first aspect. The invention in a third aspect provides a lithographic system comprising a metrology apparatus of the second aspect.

The invention further provides a computer program comprising processor readable instructions which, when run on suitable processor controlled apparatus, cause the processor controlled apparatus to perform the method of the first aspect, and a computer program carrier comprising such a computer program. The processor controlled apparatus may comprise the metrology apparatus of the second aspect or the lithographic system of the third aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
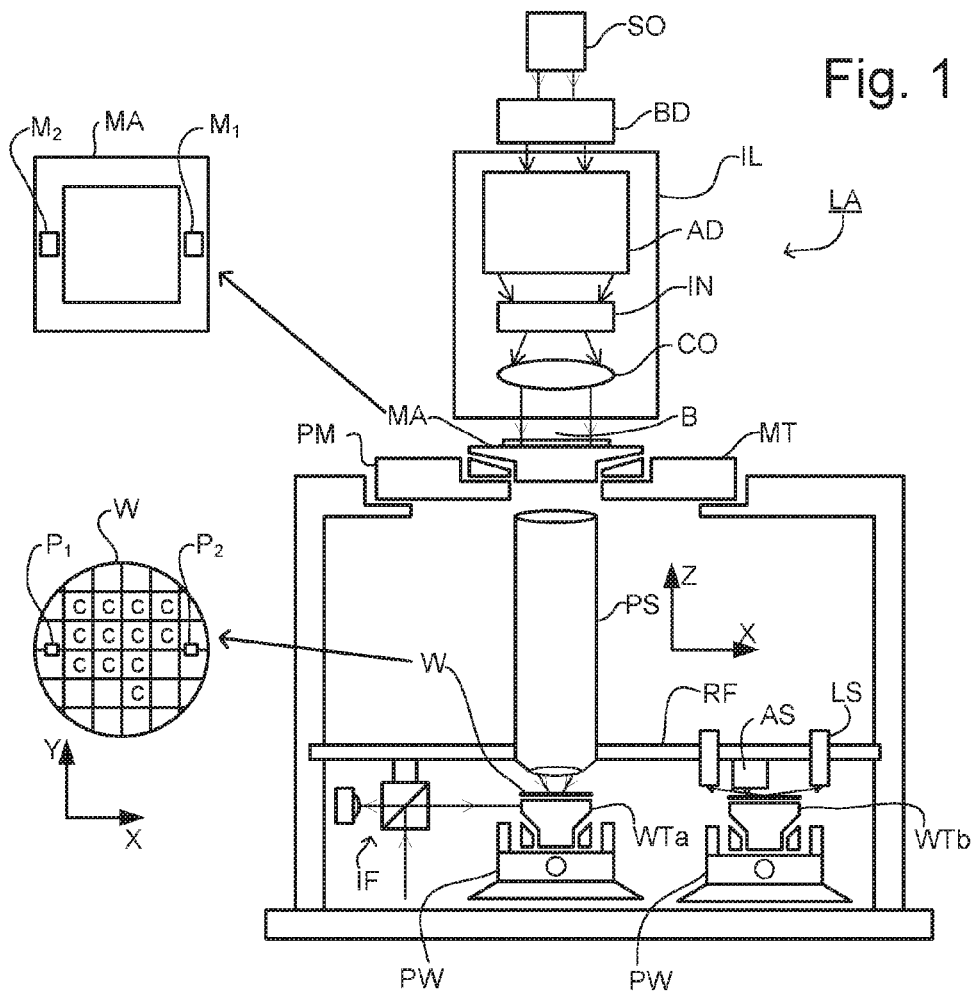
FIG. 1 depicts a lithographic apparatus.

FIG. 1 schematically depicts a lithographic apparatus LA. The apparatus includes an illumination optical system (illuminator) IL configured to condition a radiation beam B (e.g., ultraviolet (UV) radiation or deep ultraviolet (DUV) radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
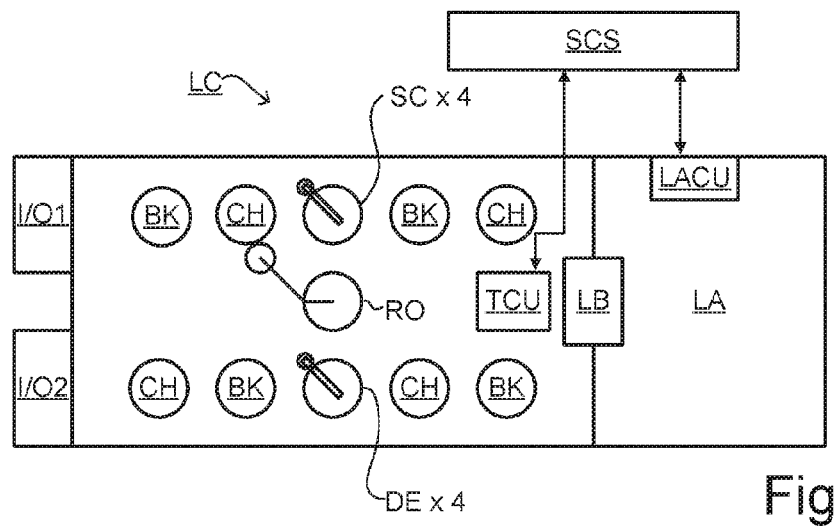
FIG. 2 depicts a lithographic cell.

As shown in FIG. 2, the lithographic apparatus LA forms part of a lithographic system, referred to as a lithographic cell LC or a lithocell. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
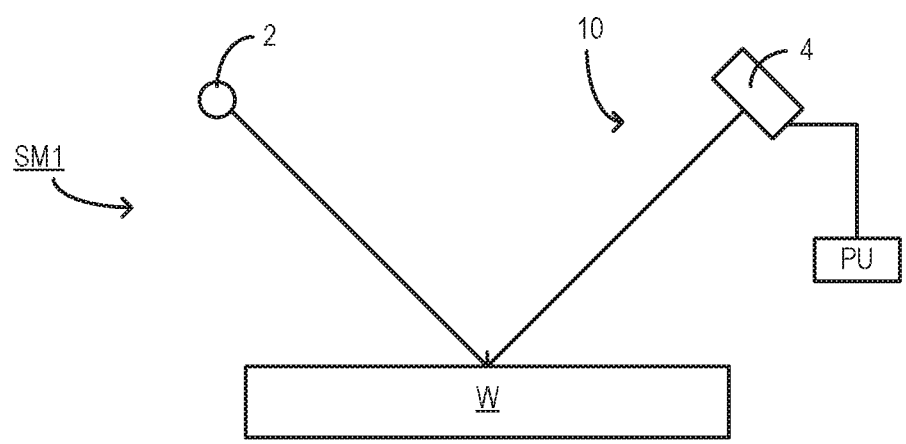
FIG. 3 depicts a first scatterometer.
Figure 3:
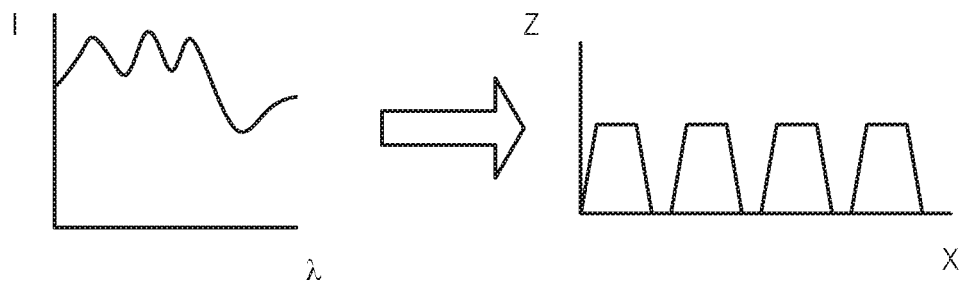

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
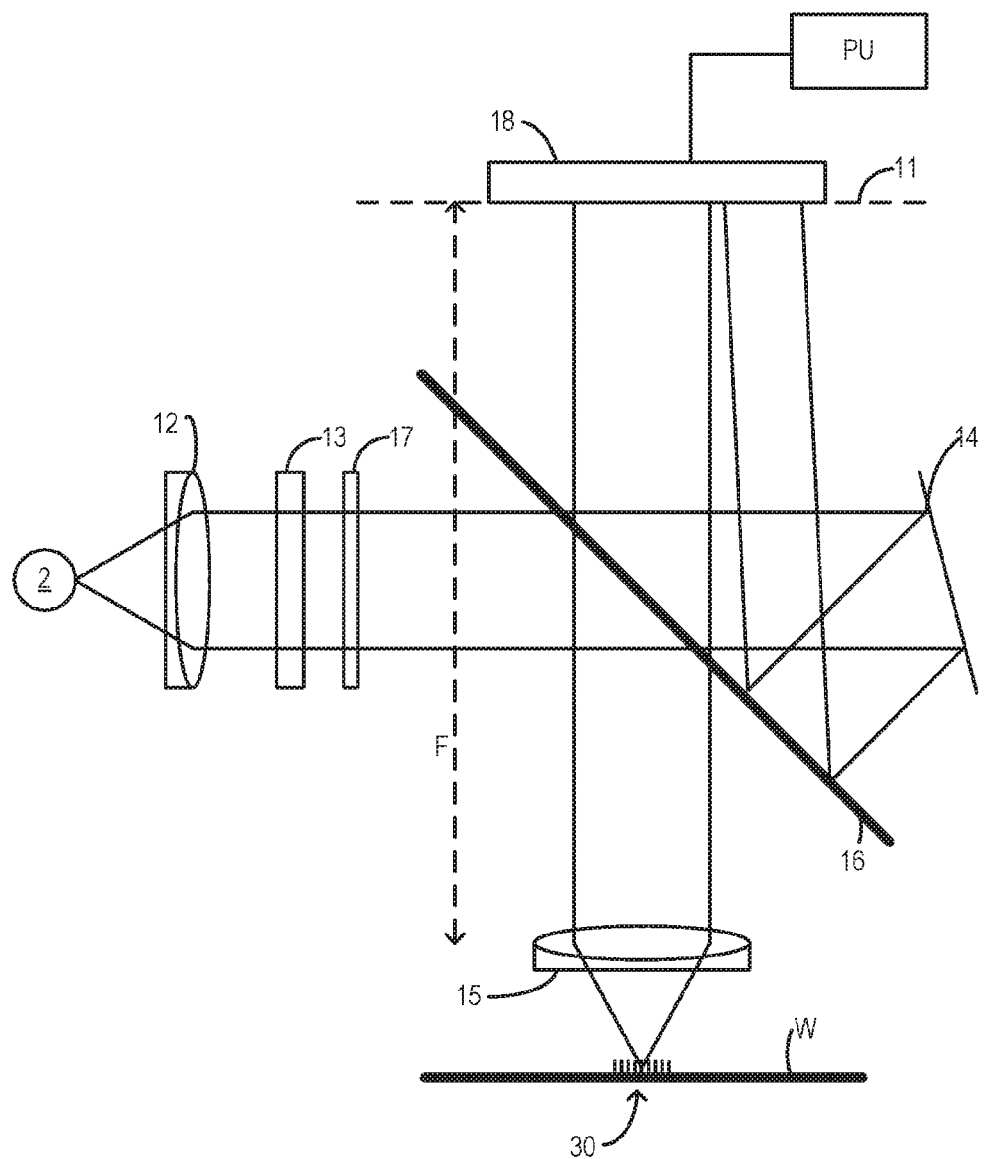
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of charge-coupled device (CCD) or complementary metal-oxide semiconductor (CMOS) sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$, and a spacing of at least 2 $\Delta\lambda$, (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay or focus metrology. Overlay metrology is a measuring system in which the overlay of two targets is measured in order to determine whether two layers on a substrate are aligned or not. Focus metrology determines the focus (and/or dose) setting used when forming the target. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using a scatterometer, such as that described above in combination with modeling of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
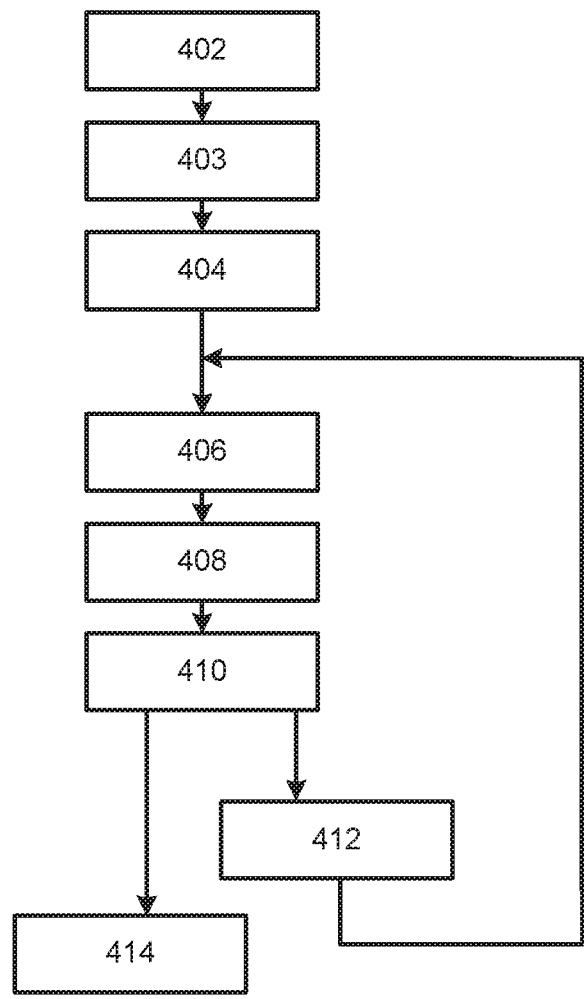
FIG. 5 is a flowchart depicting a first example process for reconstruction of a structure from scatterometer measurements.
Figure 6:
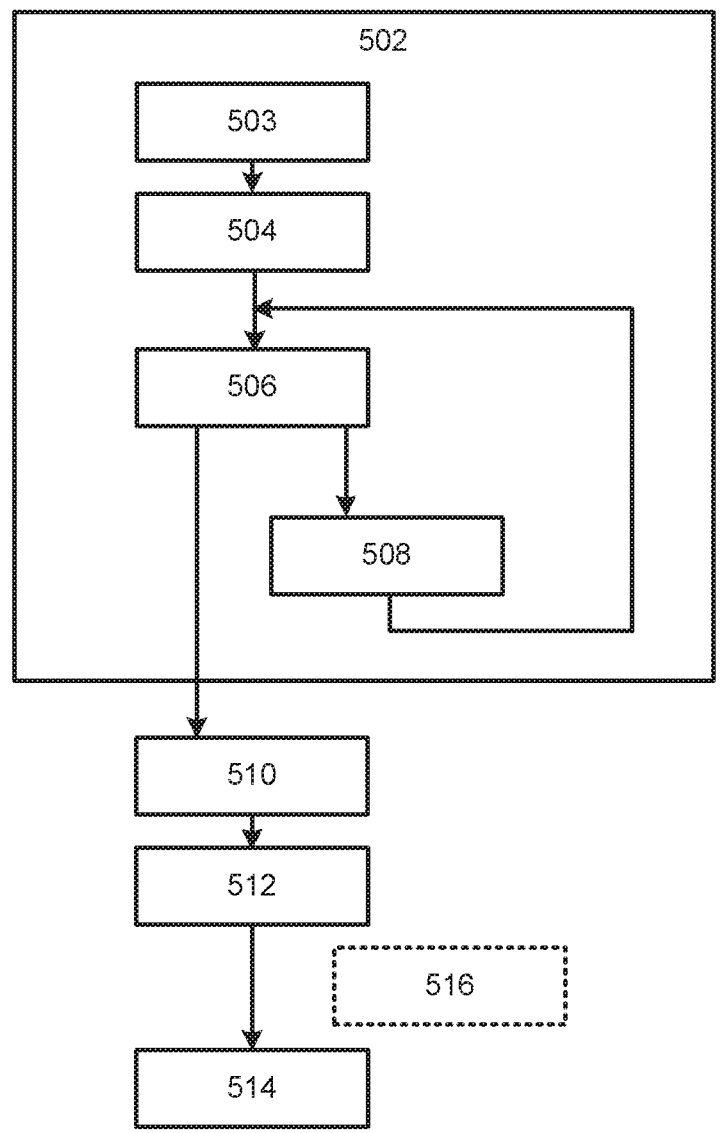
FIG. 6 is a flowchart depicting a second example process for reconstruction of a structure from scatterometer measurements.

Throughout the description of FIG. 5 and FIG. 6, the term 'diffraction image' will be used, on the assumption that the scatterometer of FIG. 3 or 4 is used. Diffraction image is an example of an inspection data element within the context of this disclosure. The skilled person can readily adapt the teaching to different types of scatterometer, or even other types of measurement instrument.

FIG. 5 is a flowchart of the steps of a method of measurement of the target shape and/or material properties, described in summary. The steps are as follows, and are then described in greater detail thereafter:

402—Measure Diffraction Image;
403—Define Model Recipe;
404—Estimate Shape Parameters $p_1^{(0)}$, $p_2^{(0)}$, $p_3^{(0)}$, . . . ;
406—Calculate Model Diffraction Image;
408—Compare Measured v Calculated Image;
410—Calculate Merit Function;
412—Generate Revised Shape Parameters $p_1^{(1)}$, $p_2^{(1)}$, $p_3^{(1)}$, . . . ;
414—Report Final Shape Parameters The target will be assumed for this description to be periodic in only 1 direction (1-D structure). In practice it may be periodic in 2 directions (2-dimensional structure), and the processing will be adapted accordingly.

402: The diffraction image of the actual target on the substrate is measured using a scatterometer such as those described above. This measured diffraction image is forwarded to a calculation system such as a computer. The calculation system may be the processing unit PU referred to above, or it may be a separate apparatus.

403: A profile is established which defines a parameterized model of the target structure in terms of a number of parameters pi (p1, p2, p3 and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the profile will define many of these to have fixed values, while others are to be variable or 'floating' parameters for the purpose of the following process steps. Moreover, ways will be introduced in which parameters can be permitted to vary without being fully independent floating parameters. For the purposes of describing FIG. 5, only the variable parameters are considered as parameters pi. The profile also defines the settings of the measurement radiation for a given target structure and how to estimate the parameter values by fitting the inspection data to the model.

404: A model target shape is estimated by setting initial values pi(0) for the floating parameters (i.e. p1(0), p2(0), p3(0 and so on). Each floating parameter will be generated within certain predetermined ranges, as defined in the recipe.

406: The parameters representing the estimated shape, together with the optical properties of the different elements of the model, are used to calculate the scattering properties, for example using a rigorous optical diffraction method such as RCWA or any other solver of Maxwell equations. This gives an estimated or model diffraction image of the estimated target shape.

408, 410: The measured diffraction image and the model diffraction image are then compared and their similarities and differences are used to calculate a "merit function" for the model target shape.

412: Assuming that the merit function indicates that the model needs to be improved before it represents accurately the actual target shape, new parameters p1(1), p2(1), p3(1), etc. are estimated and fed back iteratively into step 406. Steps 406-412 are repeated.

In order to assist the search, the calculations in step 406 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

414: When the merit function indicates that this iterative process has converged on a solution with a desired accuracy, the currently estimated parameters are reported as the measurement of the actual target structure.

The computation time of this iterative process is largely determined by the forward diffraction model used, i.e. the calculation of the estimated model diffraction image using a rigorous optical diffraction theory from the estimated target structure. If more parameters are required, then there are more degrees of freedom. The calculation time increases in principle with the power of the number of degrees of freedom, although this can be alleviated if finite differences are used to approximate the Jacobian. The estimated or model diffraction image calculated at 406 can be expressed in various forms. Comparisons are simplified if the calculated image is expressed in the same form (e.g., spectrum, pupil image) as the measured image generated in step 402.

FIG. 6 is a flowchart of the steps of an alternative method of measurement of the target shape and/or material properties, described in summary. In this method, a plurality of model diffraction images for different estimated target shapes (candidate structures) are calculated in advance and stored in a library for comparison with a real measurement. The underlying principles and terminology are the same as for the process of FIG. 5. The steps are as follows, and are then described in greater detail thereafter:

502—Generate Library;
503—Define Model Recipe;
504—Sample Shape Parameters $p_1^{(0)}$, $p_2^{(0)}$, $p_3^{(0)}$, . . . ;
506—Calculate and Store Model Diffraction Image;
508—New Sample Shape Parameters $p_1^{(1)}$, $p_2^{(1)}$, $p_3^{(1)}$, . . . ;
510—Measure Diffraction Image;
512—Compare Measured Image v Library Images;
514—Report Final Shape Parameters;
516—Refine Shape Parameters.

502: The process of generating the library begins. A separate library may be generated for each type of target structure. The library may be generated by a user of the measurement apparatus according to need, or may be pre-generated by a supplier of the apparatus.

503: A profile is established which defines a parameterized model of the target structure in terms of a number of parameters pi (p1, p2, p3 and so on). Considerations are similar to those in step 503 of the iterative process.

504: A first set of parameters p1(0), p2(0), p3(0), etc. is generated, for example by generating random values of all the parameters, each within its expected range of values.

506: A model diffraction image is calculated and stored in a library, representing the diffraction image expected from a target shape represented by the parameters.

508: A new set of shape parameters p1(1), p2(1), p3(1), etc. is generated. Steps 506-508 are repeated tens, hundreds or even thousands of times, until the library which comprises all the stored modeled diffraction images is judged sufficiently complete. Each stored image represents a sample point in the multi-dimensional parameter space. The samples in the library should populate the sample space with a sufficient density that any real diffraction image will be sufficiently closely represented.

510: After the library is generated (though it could be before), the real target 30 is placed in the scatterometer and its diffraction image is measured.

512: The measured image is compared with the modeled images stored in the library to find the best matching image. The comparison may be made with every sample in the library, or a more systematic searching strategy may be employed, to reduce computational burden.

514: If a match is found then the estimated target shape used to generate the matching library image can be determined to be the approximate object structure. The shape parameters corresponding to the matching sample are output as the measured shape parameters. The matching process may be performed directly on the model diffraction signals, or it may be performed on substitute models which are optimized for fast evaluation.

516: Optionally, the nearest matching sample is used as a starting point, and a refinement process is used to obtain the final parameters for reporting. This refinement process may comprise an iterative process very similar to that shown in FIG. 5, for example.

Whether refining step 516 is needed or not is a matter of choice for the implementer. If the library is very densely sampled, then iterative refinement may not be needed because a good match will always be found. On the other hand, such a library might be too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction images and associated refined parameter sets as new entries in the library. In this way, a library can be used initially which is based on a relatively small amount of computational effort, but which builds into a larger library using the computational effort of the refining step 516. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 406 and 506, i.e. the calculation of the estimated model diffraction image using a rigorous optical diffraction theory from the estimated target structure shape.

The creation of a profile involves multiple refinements of the profile, wherein the physical model is gradually adjusted to best represent the inspection data. The inspection data may comprise inspection data elements. The inspection data elements may be images, diffraction images (if diffraction based scatterometery is being used), spectra or pupil images; or else may be reconstructed parameter values obtained from such diffraction images etc. Each of the inspection data elements may be obtained by inspection of a corresponding target structure, e.g., using a scatterometer such as those described above. Each of these inspection data elements may be described by a plurality of intensity values. The adjustments are typically based upon the results of reconstructions. Reconstructions, as described, fit the model to the inspection data, thereby transforming the inspection data elements into parameter values. At the beginning of the procedure, reconstructions may fail as uncertainties may be large. It may therefore be more effective to reconstruct only one or a few measurements rather than the complete set of data.

To make a profile more robust, the nominal parameter values for the profile should be well chosen. Ideally, to properly estimate these nominal parameter values, many target structures should be reconstructed. However, this may take too much time. Consequently, it may be the case that only one or a few target structures are reconstructed to provide nominal parameter values. Should the selected target structure(s) not be a good representation of the target structures generally, there may be a significant bias to the measured values and the profile will not be optimal.

To obtain nominal parameter values, one or more target structure(s) may be randomly selected for reconstruction. A typical refinement is to only choose target structures which lie within a band between 30 mm and 120 mm from the center of a substrate (target structures too close to the center or edge are not considered ideal). However, it can be demonstrated that there may be significant variation in the values for certain parameters even for target structures which meet this criterion. Using the example of mid-CD (CD as measured at half the height of the object) as the parameter being considered, it can be shown that target structures within the 30 mm-120 mm band may still have a standard deviation of between $2\sigma$ and $2.5\sigma$ away from the mean value. Selecting one of these target structures for reconstruction to find nominal parameter values would be far from ideal.

It is therefore proposed to perform an unsupervised clustering or machine learning algorithm to partition the inspection data into clusters in such a way that inspection data elements within a cluster are more similar than the inspection data elements in other clusters. In unsupervised clustering, the data being clustered is unlabeled data. In this way unsupervised clustering is distinct from supervised learning techniques such as linear discriminant analysis, in which a linear combination of features is found which characterizes or separates two or more known classes of data. Analysis of the clustering enables more informed choices of target structures which better represent average values for the parameter(s) being considered.

A particular clustering algorithm needs to be given a criterion to measure the similarity of inspection data elements. To do this a metric, or distance function, may be determined. A metric is a function which defines a distance between the inspection data elements comprised within the inspection data. According to some algorithms, the smaller this distance is between two inspection data elements, the more similar the two inspection data elements are. Other clustering algorithms use probability distributions to determine the clusters. Suitable clustering algorithms may include a k-means algorithm or a Gaussian-mixture model based algorithm (e.g., Expectation-Maximization (EM) clustering), for example.

In an embodiment, the clustered data may be displayed to a user as a wafer map, wherein the target structures on a wafer (or over multiple wafers, e.g., a lot of wafers) are shown clustered according to the clustering of the inspection data elements by the clustering algorithm. This "cluster representation" map may optionally show each cluster representative, which are described below. In this way, the user can identify groups of target structures which are similar to each other.

Figure 7:
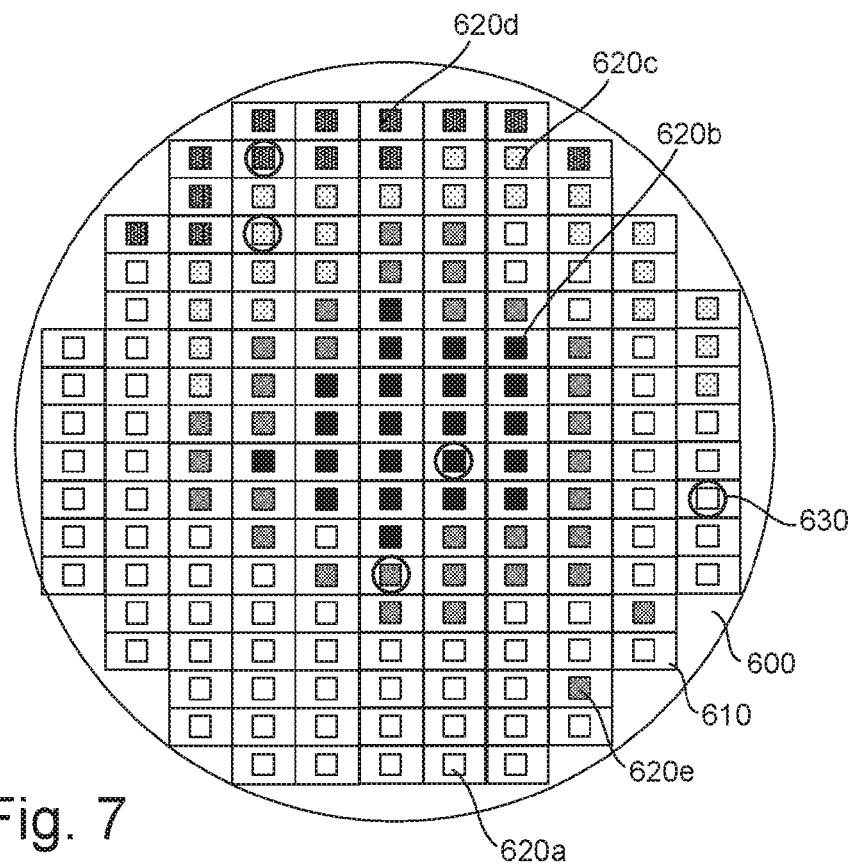
FIG. 7 depicts a cluster representation map, showing the partitioning of targets into clusters using a method according to an embodiment of the invention.

FIG. 7 shows an example of such a cluster representation map. It shows wafer (or substrate) 600 comprising fields 610. Comprised within the fields 610 are target structures grouped into five clusters 620a-620e, as indicated by the shading, such that target structures with like shading are part of the same cluster. Each cluster also has a cluster representative 630 circled.

As just mentioned, in certain embodiments, cluster representatives may be identified. A cluster representative is a target structure of a cluster which best represents the cluster dataset. The cluster representative will be a target structure within the cluster for which the value for the parameter(s) under consideration is closest to average (e.g., closest to the mean value for that parameter).

Many clustering algorithms use cluster centers to model the data, such that objects in the dataset are each allocated to a cluster comprising the nearest cluster center, in terms of the metric (there may be many refinements on this basic concept depending upon the actual clustering algorithm used). Where cluster centers are not used, they can be simply calculated from the clusters. The distribution across clusters may then be iteratively refined until the distribution no longer changes. It is proposed that each cluster representative may be chosen to be the target structure which corresponds closest to the cluster center for that cluster.

To use a specific example of a clustering algorithm, the k-means algorithm (or a variation thereon) may comprises iterations of:

assigning each object to a cluster having the nearest cluster center (cluster centers may be randomly chosen or otherwise for the first iteration); and calculating the mean of each cluster, to use as an updated cluster center for the next iteration.

This is repeated until convergence on a solution (a cluster distribution which no longer changes each iteration). As such, each cluster center will, following convergence, be the mean of the data points of its corresponding cluster.

Applying such a clustering algorithm to inspection data, comprising a plurality of inspection data elements, will yield clusters of inspection data elements (each corresponding to the target structure from which the measurement was taken). It will also yield, for each cluster, a cluster center representing the mean of that cluster (specifically, in an embodiment where the inspection data comprises diffraction images, a mean of all the intensity values describing each inspection data element). The cluster representative, in each case, can then be taken to be the target structure which best corresponds to the mean values described by the cluster center.

This may be the target structure corresponding to the inspection data element which is nearest to the cluster center, according to the metric.

Other clustering algorithms form clusters by representing the probability density function of observed variables as a mixture of multivariate normal densities. Mixture models use an expectation maximization (EM) algorithm to fit data, which assigns posterior probabilities to each component density with respect to each observation. Clusters are assigned by selecting the component that maximizes the posterior probability. Clustering using Gaussian mixture models is sometimes considered a soft clustering method. The posterior probabilities for each point indicate that each data point has some probability of belonging to each cluster. Like k-means clustering, Gaussian mixture modeling uses an iterative algorithm that converges to a local optimum. In k-means clustering, a point either belongs to a cluster or not, i.e. it is a binary assignment. It is a hard decision. In mixture model based clustering, a data point only belongs to cluster up to a degree (that degree can vary between 0 and 1); therefore a point may belong to multiple clusters, in each case with a different degree. It is a soft decision. Gaussian mixture modeling may be more appropriate than k-means clustering when clusters have different sizes and correlation within them. Like k-means clustering, mixture modelling yields natural cluster centers which can be used to derive cluster representatives.

In an embodiment, the cluster representatives can then be reconstructed. The estimated values for the parameters being considered, resultant from the reconstruction, can be used as the nominal values for a profile, as these will best represent the data for its corresponding cluster.

Figure 8:
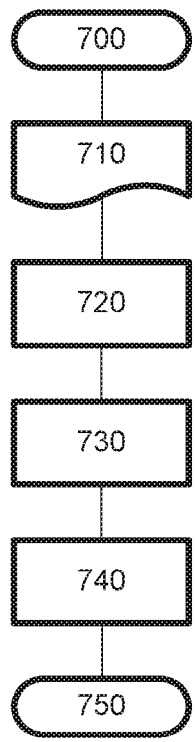
FIG. 8 is a flowchart depicting a method of metrology according to an embodiment of the invention.

FIG. 8 is a flowchart of the steps of a method for piecewise approximate reconstruction of a plurality of target structures according to an exemplary embodiment. Conventionally, when measuring the target structures on wafer, all target structures are inspected to obtain the inspection data and then each inspection data element (corresponding to a target structure) is reconstructed. Therefore, a reconstruction is performed for each target structure. The method described by the flowchart greatly reduces the number of reconstructions needed to measure a wafer. The steps are as follows, and are then described in greater detail thereafter:

700—Start;
710—Input data: Inspection data elements, Profile, Number of Clusters;
720—Cluster Inspection Data elements;
730—Reconstruct Cluster Representatives;
740—Approximate Reconstruction for Remaining Target structures;
750—End Input data 710 comprises the inspection data element set, obtained from, for example, measurements of all target structures on a wafer, a subset of these target structures or measurements of target structures over multiple wafers, e.g, a lot. The input data also comprises a profile (e.g., a CD profile) for performing a reconstruction of the target structures and (optionally) a value for the number of clusters which the inspection data is to be divided into.

At step 720, the inspection data elements are clustered, and cluster representatives identified, using one of the methods already described.

At step 730, the cluster representatives are reconstructed (using the profile), for example by using one of the methods of FIG. 5 or FIG. 6.

At step 740, the reconstruction of each of the remaining target structures in each cluster is approximated, based upon the reconstruction of the corresponding cluster representative or upon all (or a subset) of the cluster representatives.

In an embodiment, step 740 may comprise a linear reconstruction. In general, reconstruction of a target structure is a non-linear problem, such that the relationship between the inspection data and the parameter values being estimated is non-linear. However, the similarity of inspection data within a single cluster means that, for this dataset, the relationship can be approximated to a linear relationship, greatly simplifying the reconstruction. The nature of the clustering means that this linear approximation will be good for inspection data within a cluster. In an embodiment, the linearization may be a Jacobian linearization with the reconstruction of the cluster representative defining the equilibrium point.

In an embodiment, a single approximate reconstruction is performed for each (non-representative) target, based upon the cluster representative of the cluster of which it is a member (in k-means or other hard clustering) or for which it is most likely a member (in probabilistic clustering). However, in other embodiments separate approximate reconstructions (which are very quick and simple) can be performed for each single (non-representative) target based on each of the identified cluster representatives of the whole dataset. Therefore each target will have a number of reconstructed values for each parameter attributed to it, each of these values being resultant from a different cluster representative. The final reconstructed value for each parameter can then be a weighted average of each of these approximate reconstructed values. In probabilistic clustering, this weighted average may depend upon the probability distribution, and therefore the likelihood that the target is a member of each particular cluster. Values derived from reconstruction of cluster representatives of clusters for which the target has a high likelihood of being a member will have a higher weighting than those derived from reconstruction of cluster representatives of clusters for which the target has a low likelihood of being a member. For k-means type clustering, the weighted average may depend on the distance (according to the metric) between the target and each cluster representative.

The method of FIG. 8 requires a value for the number of clusters as an input (other embodiments may not require the number of clusters to be input, and instead will determine this automatically). As the method reconstructs a cluster representative for each cluster, it is apparent that the number of cluster representatives will impact the time to measure a wafer (or any selection of target structures). However, too few clusters will mean that the approximation at step 740 may be compromised. It can be shown that the number of clusters should be chosen to be between 3 and 8, and more preferably between 4 and 6. Specifically, a good choice for the number of clusters has been shown to be 5 or 6. This has been demonstrated by performing a fingerprint matching method, which measures the similarity of parameter value estimates using scatterometry methods as described herein, when compared to measurements of the parameter using another measurement tool (e.g., a scanning election microscope). It can be shown that the difference between the two measurements falls steadily as the number of clusters increases from 1 to 5, but remains fairly constant thereafter. In other words, there is nothing much to be gained from having more than five clusters, the resultant wafer map being stable when performing the method of FIG. 8 with any number of clusters over 4. Where 5 clusters are chosen, only 5 reconstructions will be necessary to approximate a full wafer map with negligible error. Where a wafer has 176 target structures, the reconstruction of the whole wafer can be performed 35 (176/5) times faster than in the conventional way.

In an alternative embodiment, the number of clusters is not input at the beginning of the algorithm, and instead the algorithm learns the number of clusters. In such an embodiment, the steps of FIG. 8 are performed multiple times for ascending numbers of clusters, starting at (for example) 1 or 2 to a chosen maximum value. For example, the method of FIG. 8 might be performed up to 10 times, for each number of clusters between 1 and 10. As the number of clusters increases, the within cluster distance metric will gradually fall. The method is performed for ascending numbers of clusters up to a point where the within cluster distance falls below a defined threshold.

The methods described above have performed the clustering on raw inspection data, which has not been processed (or has undergone minimal processing). This means that the clustering has been performed on the (e.g., diffraction) images obtained via inspection. As an alternative to this, at least one reconstruction can be performed (using a profile); this reconstruction can be used to approximately reconstruct the remaining target structures. The clustering can then be performed based on the (approximately) reconstructed parameter values. In other words, the clustering can be performed on the inspection images, on the (approximated) reconstructed parameter values from the inspection images, or on a combination of these. For the avoidance of doubt, the terms inspection data and inspection data elements in the context of this disclosure include the diffraction images, transformed diffraction images (see below) and/or reconstructed parameter values from the diffraction images.

One disadvantage of clustering based on the inspection images is that the clustering will be mainly influenced by the most sensitive features in the target structure to which the inspection image corresponds, that is the features which have the greatest impact on the inspection image should they change. It is therefore proposed, in an embodiment should it be considered necessary, to apply a transformation to the inspection images before clustering. For example, a projection on one or more principal components associated to smaller eigenvalues would make it possible to cluster on weaker target structure features. Different cluster representation maps, such as that shown on FIG. 7, can be produced for clusters obtained from the same target structures, both without transformation and with different transformations (projections on different one or more components). These cluster representation maps can be compared and analyzed.

The methods described herein result in improved efficiency of the measurement procedure (flow) in terms of speed, reliability of the results and quality of the end result including the robustness of the final profile.

While the target structures described above are metrology target structures specifically designed and formed for the purposes of measurement, in other embodiments, properties may be measured on target structures which are functional parts of devices formed on the substrate. Many devices have regular, grating-like structures. The terms 'target structure grating' and 'target structure' as used herein do not require that the structure has been provided specifically for the measurement being performed. Further, pitch P of the metrology target structures is close to the resolution limit of the optical system of the scatterometer, but may be much larger than the dimension of typical product features made by lithographic process in the target structure portions C. In practice the lines and/or spaces of the gratings within the target structures may be made to include smaller structures similar in dimension to the product features.

In association with the physical grating structures of the target structures as realized on substrates and patterning devices, an embodiment may include a computer program containing one or more sequences of machine-readable instructions describing methods of measuring target structures on a substrate and/or analyzing measurements to obtain information about a lithographic process. This computer program may be executed for example within unit PU in the apparatus of FIG. 3 or FIG. 4 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3 or FIG. 4, is already in production and/or in use, the invention can be implemented by the provision of updated computer program products for causing a processor to perform the methods as described above and as claimed.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of metrology comprising:
   acquiring inspection data, the inspection data comprising a plurality of inspection data elements, each inspection data element having been obtained by inspection of a corresponding target structure formed using a lithographic process in a lithographic system;

performing an unsupervised cluster analysis on the inspection data, thereby partitioning the inspection data into a plurality of clusters in accordance with a metric;

determining a representative inspection data element for each of the plurality of clusters, each representative inspection data element corresponding to a representative target structure formed using the lithographic process;

performing a reconstruction operation to obtain at least one reconstructed parameter value from each representative inspection data element, the at least one reconstructed parameter value comprising a value for at least one parameter of the corresponding representative target structure formed using the lithographic process; and performing a targeted reconstruction operation of each target structure, other than the representative target structures, based upon the at least one reconstructed parameter value of at least one of the representative target structures, wherein the targeted reconstruction operation for each target structure is based upon the at least one reconstructed parameter value for the representative target structure of the cluster of which that target structure is a member.

2. The method as claimed in claim 1, wherein:
the inspection data comprises measured intensities within spectra or images, and
the spectra or images comprise diffraction spectra or images obtained by the inspection using a scatterometer.

3. The method as claimed in claim 1, wherein the inspection data comprises values for at least one parameter of the corresponding target structure as determined by a subsequent reconstruction operation on the inspection data.

4. The method as claimed in claim 1, wherein the partitioning of the inspection data is performed in accordance with a relative distance, as defined by the metric, between each inspection data element and a cluster center of each cluster.

5. The method as claimed in claim 1, wherein the partitioning of the inspection data is performed in accordance with one or more statistical distribution models, such that each cluster is defined as comprising the inspection data elements belonging to the same distribution.

6. The method as claimed in claim 1, wherein each representative inspection data element is a closest to an average inspection data element, in terms of the metric, for its corresponding cluster.

7. The method as claimed in claim 1, wherein the at least one reconstructed parameter value for each representative target structure is used to derive a nominal value for at least one model parameter in subsequent reconstruction operations.

8. The method as claimed in claim 1, wherein the targeted reconstruction operation for each target is further based upon a weighted average of reconstructed parameter values for all, or a subset of, the representative target structures.

9. The method as claimed in claim 1, wherein a number of clusters is automatically learned.

10. The method as claimed in claim 9, wherein the number of clusters is automatically learned by:
performing the clustering analysis multiple times, each time partitioning the inspection data into n clusters, wherein n is chosen to be between 3 and 8 and is increased each time a cluster analysis is performed,
determining an average within cluster distance according to the metric for each cluster analysis, and
selecting the cluster analysis for which the average within cluster distance meets a threshold criterion.

11. The method as claimed in claim 1, wherein the acquiring inspection data comprises:
inspecting the target structures by illuminating each one of the target structures with measurement radiation and detecting the radiation scattered by each one of the target structures.

12. A metrology apparatus comprising:
a support configured to support a substrate having a plurality of target structures thereon, the plurality of target structures formed using a lithographic process in a lithographic system;
an optical system used in inspection of the plurality of target structures; and
a processor configured to:
acquire inspection data, the inspection data comprising a plurality of inspection data elements, each inspection data element having been obtained by the inspection of a corresponding target structure;
perform an unsupervised cluster analysis on the inspection data, thereby partitioning the inspection data into a plurality of clusters in accordance with a metric;
determine a representative inspection data element for each of the plurality of clusters, each representative inspection data element corresponding to a representative target structure formed using the lithographic process;
perform a reconstruction operation to obtain at least one reconstructed parameter value from each representative inspection data element, the at least one reconstructed parameter value comprising a value for at least one parameter of the corresponding representative target structure formed using the lithographic process; and
for each of the plurality of clusters, perform a second reconstruction operation of each target structure, other than the corresponding representative target structure, based at least on the at least one reconstructed parameter value of the corresponding representative target structure,
wherein the targeted reconstruction operation for each target is based upon a weighted average of reconstructed parameter values for all, or a subset of, the representative target structures.

13. A lithographic system comprising:
a lithographic apparatus comprising:
an illumination optical system configured to illuminate a pattern; and
a projection optical system configured to project an image of the pattern onto a substrate; and
a metrology apparatus configured to:
acquire inspection data, the inspection data comprising a plurality of inspection data elements, each inspection data element having been obtained by inspection of a corresponding target structure formed using the lithographic apparatus;
perform an unsupervised cluster analysis on the inspection data, thereby partitioning the inspection data into a plurality of clusters in accordance with a metric;
determine a representative inspection data element for each of the plurality of clusters, each representative inspection data element corresponding to a representative target structure formed using the lithographic apparatus;

perform a reconstruction operation to obtain at least one reconstructed parameter value from each representative inspection data element, the at least one reconstructed parameter value comprising a value for at least one parameter of the corresponding representative target structure formed using the lithographic apparatus; and perform a targeted reconstruction operation of each target structure, other than the representative target structures, based upon the at least one reconstructed parameter value of at least one of the representative target structures, wherein the targeted reconstruction operation for each target structure is based upon the at least one reconstructed parameter value for the representative target structure of the cluster of which that target structure is a member.

14. A computer program comprising processor readable instructions which, when run on a suitable processor controlled apparatus, cause the processor controlled apparatus to perform a method comprising:

acquiring inspection data, the inspection data comprising a plurality of inspection data elements, each inspection data element having been obtained by inspection of a corresponding target structure formed using a lithographic process in a lithographic system;

performing an unsupervised cluster analysis on the inspection data, thereby partitioning the inspection data into a plurality of clusters in accordance with a metric;

determining a representative inspection data element for each of the plurality of clusters, each representative inspection data element corresponding to a representative target structure formed using the lithographic process;

performing a reconstruction operation to obtain at least one reconstructed parameter value from each representative inspection data element, the at least one reconstructed parameter value comprising a value for at least one parameter of the corresponding representative target structure formed using the lithographic process; and performing a targeted reconstruction operation of each target structure, other than the representative target structures, based upon the at least one reconstructed parameter value of at least one of the representative target structures, wherein the targeted reconstruction operation for each target structure is based upon the at least one reconstructed parameter value for the representative target structure of the cluster of which that target structure is a member.

15. A computer program carrier comprising a computer program comprising processor readable instructions which, when run on a suitable processor controlled apparatus, cause the processor controlled apparatus to perform a method comprising:

acquiring inspection data, the inspection data comprising a plurality of inspection data elements, each inspection data element having been obtained by inspection of a corresponding target structure formed using a lithographic process in a lithographic system;

performing an unsupervised cluster analysis on the inspection data, thereby partitioning the inspection data into a plurality of clusters in accordance with a metric;

determining a representative inspection data element for each of the plurality of clusters, each representative inspection data element corresponding to a representative target structure formed using the lithographic process;

performing a reconstruction operation to obtain at least one reconstructed parameter value from each representative inspection data element, the at least one reconstructed parameter value comprising a value for at least one parameter of the corresponding representative target structure formed using the lithographic process; and performing a targeted reconstruction operation of each target structure, other than the representative target structures, based upon the at least one reconstructed parameter value of at least one of the representative target structures, wherein the targeted reconstruction operation for each target is based upon a weighted average of reconstructed parameter values for all, or a subset of, the representative target structures.

* * * * *